(12) United States Patent
Cano

(10) Patent No.: US 8,144,533 B2
(45) Date of Patent: Mar. 27, 2012

(54) COMPENSATORY MEMORY SYSTEM

(75) Inventor: Francisco A. Cano, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 12/762,297

(22) Filed: Apr. 16, 2010

(65) Prior Publication Data

US 2010/0265779 A1  Oct. 21, 2010

Related U.S. Application Data

(60) Provisional application No. 61/170,005, filed on Apr. 16, 2009.

(51) Int. Cl.
*G11C 7/00* (2006.01)
(52) U.S. Cl. .................. 365/194; 365/230.06; 365/233.1
(58) Field of Classification Search .................. 365/194, 365/230.06, 233.1
See application file for complete search history.

(56) References Cited

U.S. PATENT DOCUMENTS 6,608,795 B2 *  8/2003  Arimoto et al. .......... 365/230.03

* cited by examiner

*Primary Examiner* — Son Dinh
*Assistant Examiner* — Nam Nguyen
(74) *Attorney, Agent, or Firm* — John R. Pessetto; W. James Brady; Frederick J. Telecky, Jr.

(57) ABSTRACT

A compensatory memory system is described. This memory system substantially improves performance by adapting an associated delay in a way that optimizes circuit performance.

15 Claims, 3 Drawing Sheets

COMPENSATORY MEMORY SYSTEM

CROSS REFERENCE TO RELATED APPLICATION(S)

The present application claims priority to jointly owned U.S. Provisional Application corresponding to application No. 61/170,005 entitled "Method for Adaptive Memory Timing for Improved Performance." This provisional application was filed on Apr. 16, 2009.

DESCRIPTION OF RELATED ART

With the evolution of electronic devices, there is a continual demand for enhanced speed, capacity and efficiency in various areas including electronic data storage. Motivators for this evolution may be the widespread use of various types of electronic devices from computer systems that enable various activities including watching movies to cellular phones with cameras. One of the most potential limitations to this evolution may be the memory systems within these devices. Consequently, there is a quest for improving the performance and speed, which may improve the computation power of the associated device. Thus, there remain unmet needs in the area of memory systems.

BRIEF DESCRIPTION OF THE DRAWINGS

The compensatory memory system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1:
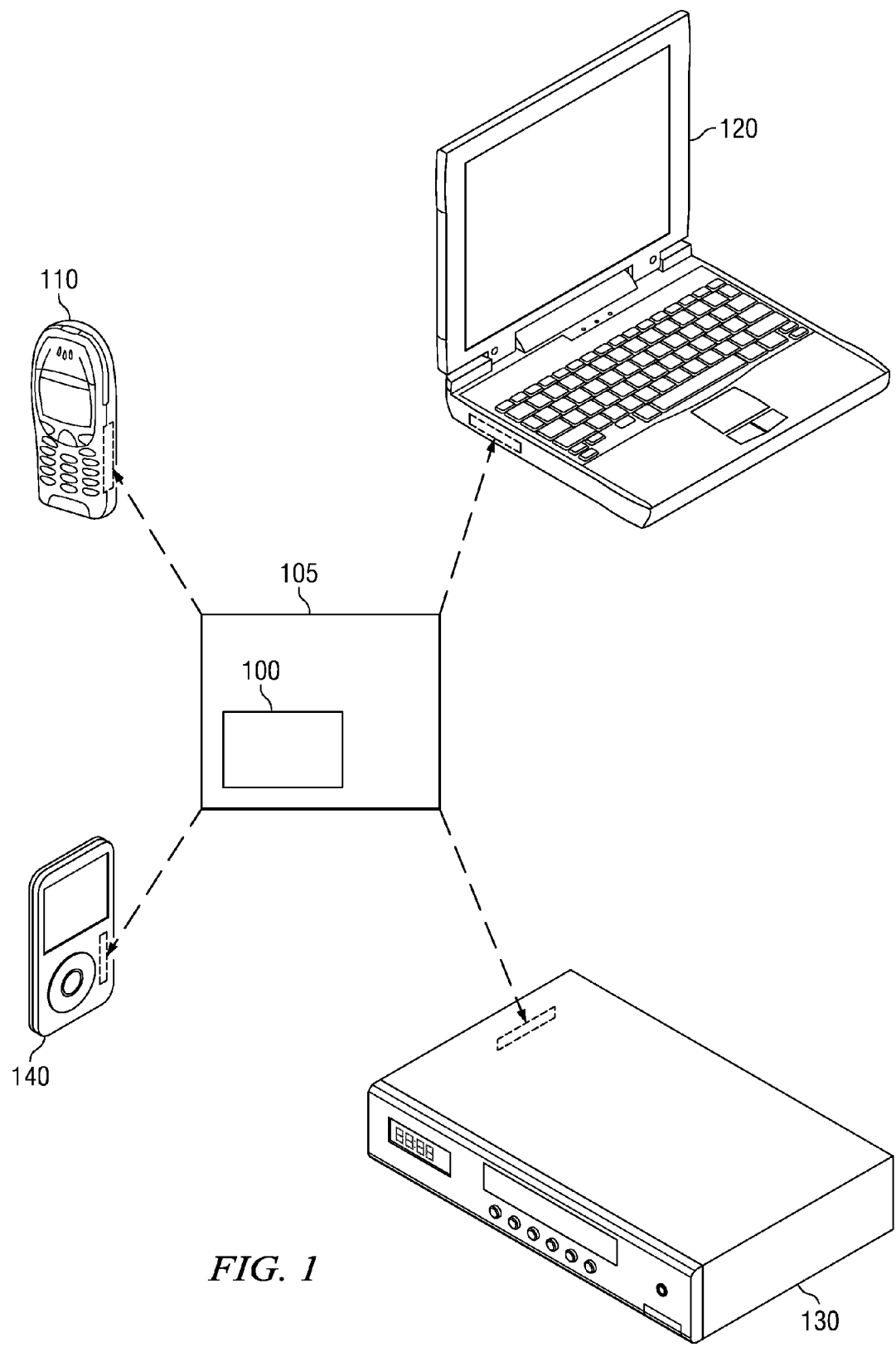
FIG. 1 is an environmental drawing illustrating various systems that may utilize the compensatory memory system.

While the compensatory memory system is susceptible to various modifications and alternative forms, specific embodiments have been shown by way of example in the drawings and subsequently are described in detail. It should be understood, however, that the description herein of specific embodiments is not intended to limit the compensatory memory system to the particular forms disclosed. In contrast, the intention is to cover all modifications, equivalents, and alternatives falling within the spirit and scope of the compensatory memory system as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

FIG. 1A is an environmental drawing illustrating various systems that may utilize the compensatory memory system (CMS) 100. The CMS 100 provides capacity for data storage and may include any one or more of the following memory types: as static random access memory (SRAM), dynamic random access memory (DRAM), read only memory (ROM), or the like. An integrated circuit 105 often facilitates the transfer of information from the CMS 100 to other components within the environment. In addition, the type of information stored by the CMS 100 may vary depending on the type of environment that it is used within. Regardless of the environment, this CMS substantially improves performance by adapting an associated delay in a way that optimizes circuit performance. In some implementations, the CMS 100 may be housed within a cellular phone 110, computing device 120 (e.g., laptop), data readable drive 130 (e.g., DVD drive), or portable media device 140 (e.g., MP3 player). However, this is only a sample of some of the environments where the CMS 110 may be used. Other environments may include a cell phone base station, network router, or any other environment where there needs to be a correlation between various components.

Figure 2:
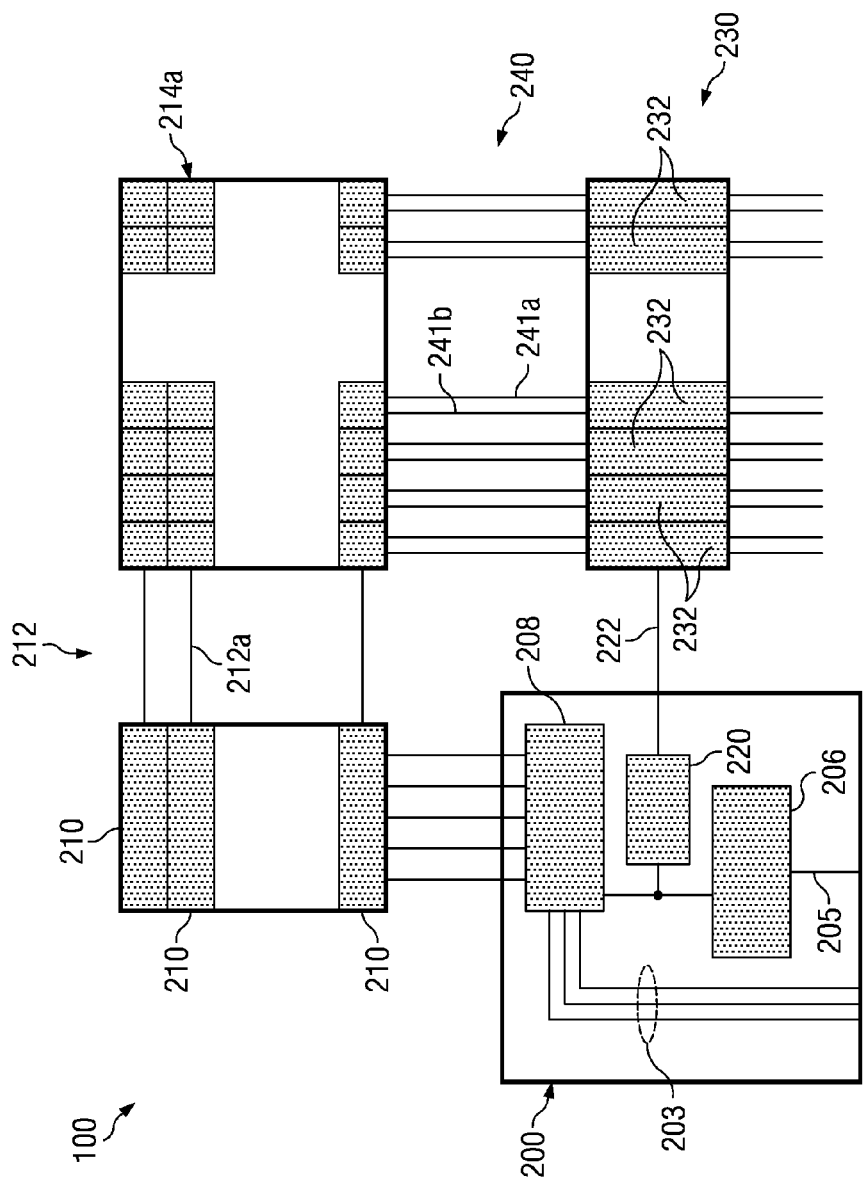
FIG. 2 is a block diagram illustrating components within the integrated circuit of FIG. 1.

FIG. 2 is a block diagram illustrating components within the CMS 100. A control block 200 may receive addresses on address lines 203 and a clock signal on the clock line 205 from devices external to the CMS 100. For example, the address may be received from a central processing unit, direct memory access controller, or an external source, while the clock signal may be received from a master clock associated with a given environment. When the CMS 100 is included with the cellular phone 110, the clock signal may be the master clock for this cellular phone. The control block 210 may include a clock generator 206 that receives a first clock signal, which may be an external clock signal. This clock generator may be selected using any of the following criteria: rising edge of clock, falling edge of clock, internal access done signal, combined with one or more external signals. In fact, the clock generator 206 generates a second clock signal, which may be a multiple of the first clock signal or have some other correlation to the first clock signal.

The clock generator 206 generates a second clock signal that gets routed to pre-decode logic 208. This pre-decode logic also receives the first group of addresses applied to the address lines 203. In response, the pre-decode logic 208 may transmit a second group of addresses at a select time along lines 209 to row decoders 210. These decoders may transmit a word line enable signal along the lines 212 corresponding to the particular word line that should be enabled. For example, a word line enable signal may be applied to the line 212a for activating one of the bits in the word line 214a. To facilitate this process, the pre-decode logic 208 may include various types of logic, such as logic functions NAND, NOR, inverter, buffers or the like. For example, this pre-decode logic may include a register for storing addresses, such as a linear shift register. In addition, the decoders 210 may be one of various types of decoders, such as dynamic decoders or static decoders.

Finally the control block 200 includes a compensatory delay device 220. This delay device transmits a sense enable along sense enable line 222 in response to receiving the first clock signal. The collection 230 of sense amplifiers 232 receives the sense enable on this sense enable line and also receives data along the bit lines 240. As illustrated, these bit lines are differential such that a transition from one state to the next may be associated with a minimum separation threshold between associated bit lines. For example, the bit line 241a may represent one bit line, while the bit line 241b may represent the converse of the bit line 241a, or bit bar. In another implementation a single bit line may be used with a defined reference level, which may originate from a reference generator or the inherent trip point of the sense amplifier.

As the second clock transitions from a first state (e.g., logic low) to a second state (e.g., logic high), the signal applied to the word line 212a may transition from a first state (e.g., logic low) to a second state (e.g., logic high) after a first delay. After a second delay, the signals applied to bit lines 240 transition from a first state to a second state. In the case of a one-shot sense amplifier that reads out the data from the bit lines 240, enabling these amplifiers after a minimum bit line separation is important. Thus, the compensatory delay logic 220 tracks the decoder delay, first delay, and second delay, minus the minimum trigger delay.

The design of the compensatory delay logic 220 helps it effectively adapt for the various delays within the system. As mentioned above, this delay logic uses voltage scaling, which generally involves identifying a voltage scaling model. Some voltage scaling models include the following: strong corner/weak corner models, mixed corner models, minimum voltage threshold models, and maximum voltage threshold models and corresponding operating supply voltages for each. Other aspects that may affect a voltage scaling model may including temperature, interconnects corners, and other parameters that affect speed and power. After selection of the model, numerical values may be selected, such as a weak corner may have approximately 1000 mV for a frequency of approximately 1 GHz, while a strong corner may have approximately 800 mV for approximately 1 GHz, which would mean 200 mV of voltage scaling. Alternatively, the voltage scaling may be only 150 mV, which can then become the target for associated components, such as the compensatory delay device 220. Any numbers used in this application is for illustrative purposes only and numerous alternative implementations for the compensatory memory system 100 may result from using different numbers.

Figure 3:
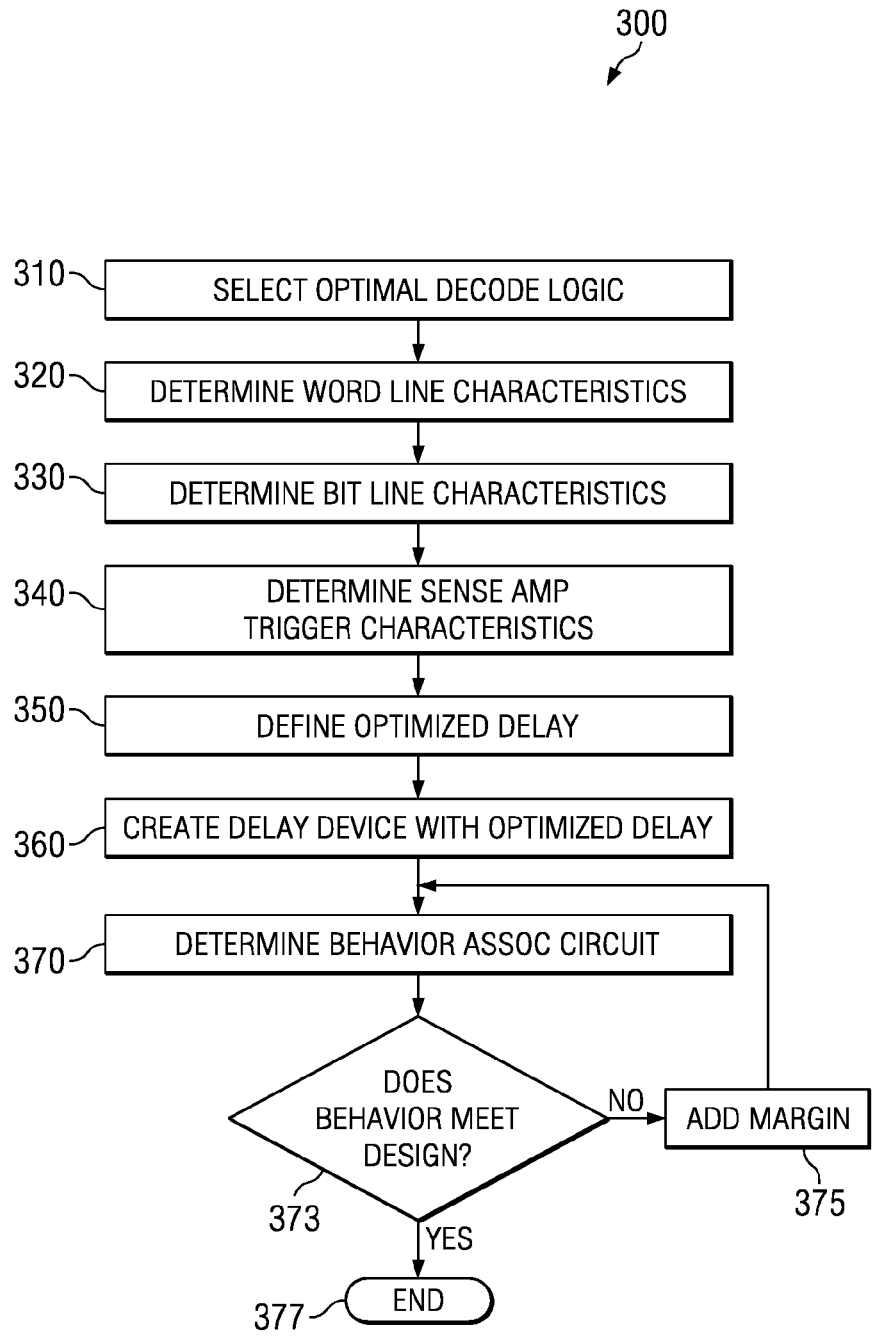
FIG. 3 is a flow chart illustrating a method for designing a compensatory memory system.

FIG. 3 is a flow chart 300 illustrating a method for designing the compensatory memory system 100. Though each of the blocks in this figures are numbered sequentially, this represents one of many possible implementations for this method. Numerous alternative implementations for designing the alternative memory system 100 may result from reordering one or more of these blocks or for performing any of these blocks in parallel.

In block 310, optimal decode logic is selected. Referring back to FIG. 2, the decoders 210 and the pre-decode logic 208 generally relate to decode logic. Therefore, this step generally involves assessing and optimizing the timings, area and power associated with this decode logic. Timings are typically associated with a slow process corner and the power of this decode logic at the fast process corner. While this flow chart begins at block 300, and alternative implementation may have a flowchart that begins by selecting a voltage scaling model. For that implementation, design objectives may govern the selection of any of the following conditions along with a corresponding voltage: strong corner/weak corner models, mixed corner models, minimum voltage threshold models, and maximum voltage threshold models; high temperature or low temperature; fast or slow interconnect.

Block 310 may be followed by block 320. In this block, characteristics of the word lines 212 may be determined. This may include determining how much time passes after a clock transition before an associated word line transitions, or the delay of the word line. Other characteristics may include optimization of routing resources or power consumption. After block 320, the bit line characteristics may be determined in block 330. Characteristics of the bit lines 240 may include determining how much time passes after a word line transition before associated bit lines reach minimum acceptable separation, or transition, which may be the delay of the bit line. In addition, this block includes determining the invariant portion of any statistical variation in transistors which drive the bit lines 240. Other characteristics of the bit line that may be determined in this block include segmentation into blocks, shielding from other signals, precharge time.

Block 340 may follow block 330. In block 340, the sense amplifier trigger characteristics may be determined. In one implementation, this may involve determining a maximum speed at which the sense amplifiers 230 may be triggered. In an alternative implementation, other characteristics of the sense amp, such as power consumption, area, output drive strength, precharge time may be determined.

Block 340 is followed by block 350. In this block, an optimized delay is defined. In one implementation, this optimized delay may be approximately equal to a fraction of the sum delay associated with the decode logic, the delay of the word line, and the delay of the bit line associated with meeting minimum acceptable separation. This fraction may be based on compensating for those delays, while utilizing the maximum trigger speed for the amplifiers 230. Block 360 follows block 350. In block 360, a delay device with the optimized delay, like the compensatory delay device 220, is created. If this compensatory delay device comprises an array of buffers, this may include configuring these buffers such that the total delay from input to output is the optimized delay. In one implementation, the compensatory delay device 220 may comprise a resistor and capacitor network, chain of inverters, chain of NOR gates.

In a different implementation, the flowchart 300 may include optional blocks 370-377. Block 370 may include determining the behavior of functionality of an associated circuit that includes a delay device with the optimized delay. Behavior may include either performance or functionality. Block 373 follows block 370, which determines whether the behavior meets a desired d. If the performance or functionality is below the desired standard, the "no" branch is followed from block 373 to block 375. In this block, margin is added to the optimized delay. After block 375, block 370 may be repeated so that the performance or functionality of the associated circuit is once again determined. If it is determined at block 373 that the associated circuit performance does meet the desired standard, a "yes" branch may be followed from block 373 to an end block 377.

Thus the compensatory delay logic is designed such that it bounds the decoder delay, first delay, and second delay, minus the minimum trigger delay. This ensures that the sense amplifier is only triggered after sufficient separation has been achieved.

While various embodiments of the compensatory memory system have been described, it may be apparent to those of ordinary skill in the art that many more embodiments and implementations are possible that are within the scope of this system. Although certain aspects of the compensatory memory system may be described in relation to specific techniques or structures, the teachings and principles of the present system are not limited solely to such examples. All such modifications are intended to be included within the scope of this disclosure and the present compensatory memory system and protected by the following claim(s).

The invention claimed is:

1. A compensatory memory system with voltage scaling, comprising:
   a clock generator for transmitting a second clock signal in response to receiving the first clock signal;
   a first decode logic block for receiving a first group of addresses associated with data storage locations and the second clock signal, the first decode logic block operative for transmitting a second group of addresses in response to receiving the first group of addresses;

a compensatory delay device coupled for receiving the second clock signal and operative for transmitting an enable signal;

wherein the compensatory delay device is designed using a slow process corner and the compensatory memory system with voltage scaling has increased performance by compensating for logic delays an amplifier trigger speed.

2. The compensatory memory system of claim 1, further comprising:
- a plurality of decoders;
- a plurality of word lines, where a decoder is associated with each word line;
- a plurality of bit lines; and
- a plurality of amplifiers, where an amplifier is associated with pairs of bit lines.

3. The compensatory memory system of claim 2, wherein each of the sense amplifiers receive the enable signal, and the compensatory delay device compensates for delays associated with the decoders, the word lines, and bit lines.

4. The compensatory memory system of claim 2, wherein the compensatory delay device tracks an invariant portion of a statistical variation associated with each of the bit lines.

5. The compensatory memory system of claim 1 wherein the amplifiers are sense amplifiers and the amplifier trigger speed is a maximum amplifier trigger speed.

6. The compensatory memory system of claim 1, wherein the compensatory delay device operates at an optimized delay.

7. The compensatory memory system of claim 1, wherein the optimized delay includes a margin for further enhancing performance.

8. The compensatory memory system of claim 1, wherein the compensatory memory system is of a memory type selected from the group consisting of static random access memory, dynamic random access memory, and read only memory.

9. A compensatory memory system with voltage scaling, comprising:
- a register for storing a plurality of addresses for identifying a plurality of bits;
- a decoder adapted to be coupled for receiving the addresses and a clock signal;
- a compensatory delay device coupled to receive the clock signal and transmit an enable signal;
- an amplifier coupled to transmit a data signal in response receiving the enable signal, wherein the compensatory delay device is designed using a slow process corner and the compensatory memory system with voltage scaling has increased performance by compensating for a maximum trigger speed of the amplifier and a delay associated with a tracking element.

10. A method for designing an compensatory memory system having a word line and a bit line, steps of the method comprising:
- selecting optimal decode logic based on a slow process corner;
- determining word line characteristics;
- determining bit line characteristics;
- determining sense amplifier trigger characteristics;
- defining an optimized delay;
- creating a delay device with the optimized delay;
- determining an compensatory delay that compensates for the maximum timing characteristic of the word line, bit line, and the maximum trigger speed; and
- adding a delay margin when the compensatory delay does not meet desired performance standard.

11. The method of claim 10 further comprising the steps of:
- determining the performance of an associated circuit;
- determining whether the performance meets a desired standard; and
- adding the delay margin when the compensatory delay meets the desired standard.

12. The method of claim 10, wherein determining bit line characteristics further comprises determining a maximum separation of associated bitlines.

13. The method of claim 10, wherein determining word line characteristics further comprise determining a word line delay.

14. The method of claim 10, wherein determining bit line characteristics further comprises determining a bit line delay.

15. The method of claim 10, wherein selecting the optimal decode logic further comprises determining a delay associated with decode logic.

* * * * *